(12) United States Patent
Arai et al.

(10) Patent No.: US 8,309,956 B2
(45) Date of Patent: Nov. 13, 2012

(54) THIN FILM TRANSISTOR, DISPLAY UNIT, AND METHOD OF MANUFACTURING THIN FILM TRANSISTOR

(75) Inventors: Toshiaki Arai, Kanagawa (JP); Narihiro Morosawa, Kanagawa (JP); Kazuhiko Tokunaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 245 days.

(21) Appl. No.: 12/629,283

(22) Filed: Dec. 2, 2009

(65) Prior Publication Data

US 2010/0133525 A1 Jun. 3, 2010

(30) Foreign Application Priority Data

Dec. 3, 2008 (JP) ................................. 2008-308271

(51) Int. Cl.
- *H01L 29/10* (2006.01)
- *H01L 29/12* (2006.01)
- *H01L 29/08* (2006.01)
- *H01L 35/24* (2006.01)
- *H01L 51/00* (2006.01)
- *H01L 31/102* (2006.01)

(52) U.S. Cl. ............ 257/43; 257/40; 257/184; 257/187; 257/192

(58) Field of Classification Search ...... 257/40, 257/43, 184, 187, 192, 213–413; 438/142–308, 438/758–794
See application file for complete search history.

(56) References Cited

U.S. PATENT DOCUMENTS

| | | | |
|---|---|---|---|
| 6,709,902 B2 * | 3/2004 | Kitakado et al. | 438/149 |
| 6,855,954 B1 * | 2/2005 | Zhang | 257/59 |
| 7,265,384 B2 | 9/2007 | Oh | |
| 2001/0011868 A1 * | 8/2001 | Fukunaga et al. | 313/506 |
| 2001/0039081 A1 * | 11/2001 | Miyamoto et al. | 438/149 |
| 2002/0020875 A1 | 2/2002 | Arao et al. | |
| 2002/0047579 A1 * | 4/2002 | Kunii et al. | 315/169.3 |
| 2002/0123175 A1 | 9/2002 | Yamazaki et al. | |
| 2003/0089909 A1 * | 5/2003 | Miyairi et al. | 257/59 |

(Continued)

FOREIGN PATENT DOCUMENTS

JP 2006-165529 6/2006

(Continued)

OTHER PUBLICATIONS

Hayashi. R. et al., "Improved Amorphous In-Ga-Znn-O TFTs", SID Proceedings, 2008, pp. 621-624.
Arai, T. et al.; "Thin Film Transistor and Display Unit," U.S. Appl. No. 12/696,270, filed Jan. 10, 2010.

*Primary Examiner* — Fernando L Toledo
*Assistant Examiner* — Karen Musumakar
(74) *Attorney, Agent, or Firm* — SNR Denton US LLP

(57) ABSTRACT

A thin film transistor includes: a gate electrode; a gate insulting film formed on the gate electrode; an oxide semiconductor thin film layer forming a channel region corresponding to the gate electrode on the gate insulating film; a channel protective layer that is formed at least in a region corresponding to the channel region on the gate insulating film and the oxide semiconductor thin film layer, and that includes a first channel protective layer on a lower layer side and a second channel protective layer on an upper layer side; and a source/drain electrode that is formed on the channel protective layer and is electrically connected to the oxide semiconductor thin film layer. The first channel protective layer is made of an oxide insulating material, and one or both of the first channel protective layer and the second channel protective layer is made of a low oxygen permeable material.

13 Claims, 12 Drawing Sheets

U.S. PATENT DOCUMENTS

| | | |
|---|---|---|
| 2003/0203545 A1 | 10/2003 | Hamada et al. |
| 2006/0092191 A1* | 5/2006 | Sakai et al. ............... 347/1 |
| 2007/0072439 A1 | 3/2007 | Akimoto et al. |
| 2007/0085112 A1* | 4/2007 | Yamazaki et al. ......... 257/288 |
| 2007/0170434 A1 | 7/2007 | Inoue et al. |
| 2009/0065784 A1* | 3/2009 | Kobayashi et al. ......... 257/72 |
| 2009/0278120 A1* | 11/2009 | Lee et al. ................. 257/43 |

FOREIGN PATENT DOCUMENTS

| | | |
|---|---|---|
| JP | 2006-165532 | 6/2006 |
| JP | 2007-115808 | 5/2007 |

* cited by examiner

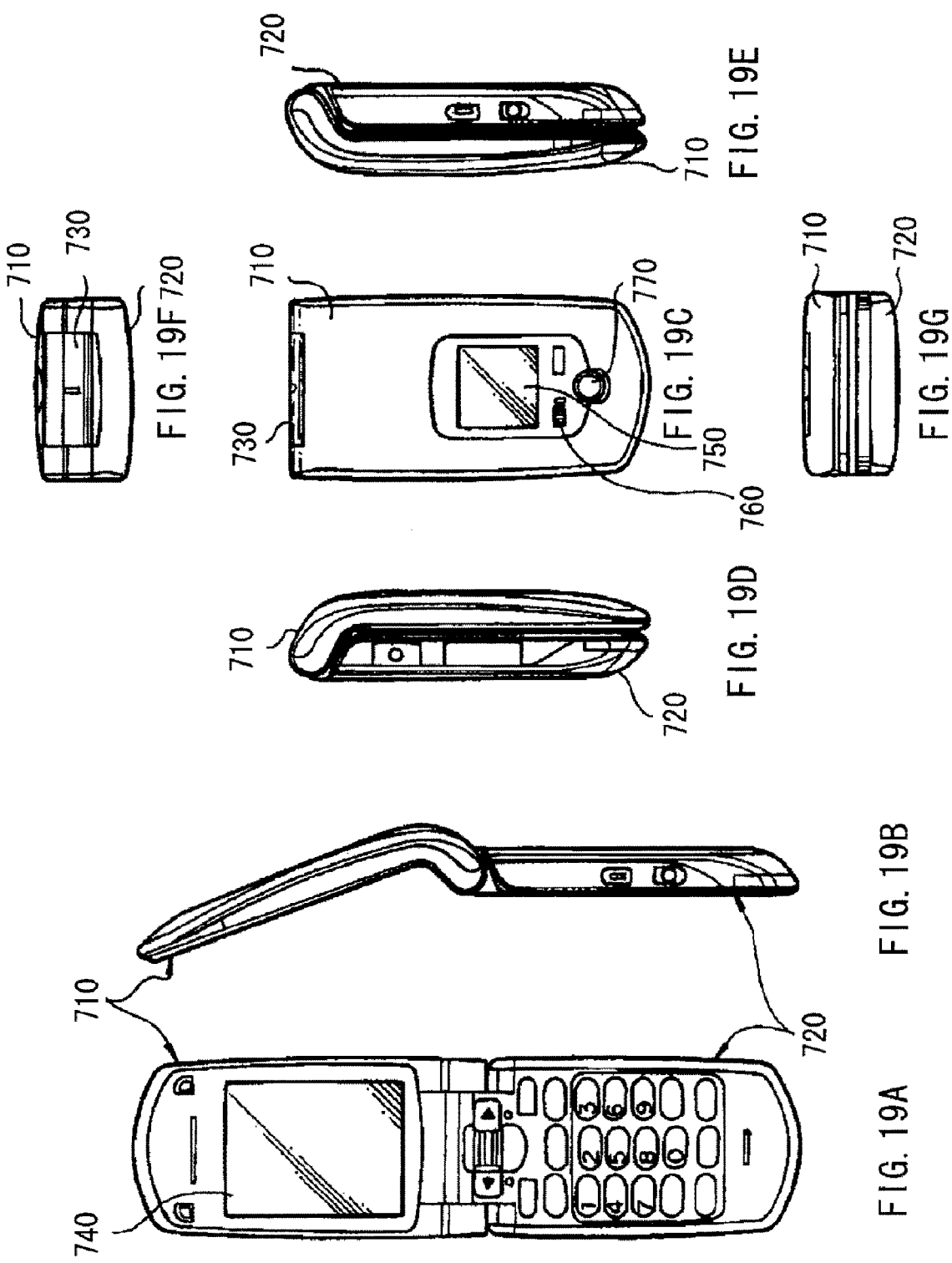

THIN FILM TRANSISTOR, DISPLAY UNIT, AND METHOD OF MANUFACTURING THIN FILM TRANSISTOR

BACKGROUND OF THE INVENTION

1. Field of the Invention

The present invention relates to a thin film transistor (TFT) including an oxide semiconductor thin film layer, a method of manufacturing the same, and a display unit including such a thin film transistor.

2. Description of the Related Art

It has been known that an oxide (oxide semiconductor) composed of zinc, indium, gallium, tin, or a mixture thereof shows superior semiconductor characteristics. Thus, in recent years, applying the oxide semiconductor to a TFT as a drive element of an active matrix display has been actively studied.

In the TFT including the oxide semiconductor, electron mobility ten times or more of that of the existing TFT including amorphous silicon is shown and favorable off-characteristics are shown. Thus, the TFT including the oxide semiconductor is largely expected to be applied to a large-screen, high-definition, and high-frame-rate liquid crystal display and an organic EL display.

Meanwhile, in the oxide semiconductor, the heat resistance is not sufficient. Thus, due to heat treatment or plasma treatment in a manufacturing process of the TFT, oxygen is detached and lattice defect is formed. The lattice defect results in forming an electrically shallow impurity level, and causes low resistance of the oxide semiconductor. Thus, in the case where the oxide semiconductor is used for an active layer of the TFT, the defect level is increased, the threshold voltage is decreased, the leakage current is increased, resulting in depression type operation in which a drain current is flown without applying a gate current. If the defect level is sufficiently increased, transistor operation is stopped to shift to semiconductor operation.

Further, in addition to the foregoing lattice defect, hydrogen has been reported as an element to form an electrically shallow impurity level. Thus, in addition to the lattice defect, an element such as hydrogen introduced in manufacturing steps of the TFT has been regarded as a substance that affects characteristics of the TFT including the oxide semiconductor.

Thus, for the purpose of resolving the foregoing disadvantages, for example, TFTs disclosed in "Improved Amorphous In—Ga—Zn-0 TFTs," Ryo Hayashi et al., SID2008 Proceedings, 2008, pp. 621-624 and Japanese Unexamined Patent Application Publication No. 2007-115808 have been proposed.

SUMMARY OF THE INVENTION

In the foregoing "Improved Amorphous In—Ga—Zn-0 TFTs," a channel protective layer is formed from a silicon oxide film, and a passivation film is formed from a silicon nitride film. In this technique, to prevent oxygen detachment after forming an active layer, the channel protective layer is formed by using silicon oxide immediately after forming the active layer, and then a source/drain electrode is formed and patterned. As a thin film through which oxygen hardly passes, the passivation film is formed by using the silicon nitride film.

However, in such a technique, since both protective films (the channel protective layer and the passivation film) are formed, two photolithography steps are necessitated. Further, before forming the passivation film, at least three high temperature heat steps (forming the channel protective layer, forming the source/drain electrode layer, and forming the passivation film) are performed. Thus, there has been the following disadvantage. That is, without whether or not oxygen detachment from the oxide semiconductor thin film layer is generated, after forming the passivation film, due to existence of the passivation film through which oxygen hardly passes, oxygen is hardly supplied to the oxide semiconductor thin film layer.

Meanwhile, in the foregoing Japanese Unexamined Patent Application Publication No. 2007-115808, a channel protective layer is not formed. In such a TFT structure, a first passivation film made of a silicon oxide film and a second passivation film made of a silicon nitride film are able to prevent oxygen from being detached in a step of forming passivation, and the steps are able to be simplified.

However, in such a technique, there is a disadvantage that oxygen detachment or the like is generated in a step of forming a source/drain electrode and thus favorable transistor characteristics are not able to be obtained. That is, to restore the favorable transistor characteristics, it is necessary to resupply oxygen after forming the source/drain electrode.

As described above, in the existing technologies, it has been difficult to decrease oxygen detachment in the oxide semiconductor thin film layer and to improve reliability with the use of a simple structure.

In view of the foregoing disadvantages, in the invention, it is desirable to provide a thin film transistor that includes an oxide semiconductor thin film layer and is able to improve reliability with the use of a simple structure, a method of manufacturing the same, and a display unit including such a thin film transistor.

According to an embodiment of the invention, there is provided a thin film transistor including a gate electrode; a gate insulting film formed on the gate electrode; an oxide semiconductor thin film layer forming a channel region corresponding to the gate electrode on the gate insulating film; a channel protective layer that is formed at least in a region corresponding to the channel region on the gate insulating film and the oxide semiconductor thin film layer, and that includes a first channel protective layer on a lower layer side and a second channel protective layer on an upper layer side; and a source/drain electrode that is formed on the channel protective layer and is electrically connected to the oxide semiconductor thin film layer. The first channel protective layer is made of an oxide insulating material, and one or both of the first channel protective layer and the second channel protective layer is made of a low oxygen permeable material.

According to an embodiment of the invention, there is provided a display unit including: a display device; and a thin film transistor for driving the display device.

In the thin film transistor and the display unit of the embodiments of the invention, since the first channel protective layer is made of the oxide insulating material, and one or both of the first channel protective layer and the second channel protective layer is made of the low oxygen permeable material, oxygen detachment from the oxide semiconductor thin film layer is inhibited. Further, since the source/drain electrode is formed on the upper layer of the channel protective layer, oxygen detachment from the oxide semiconductor thin film layer is inhibited at the time of forming the source/drain electrode as well. Furthermore, since the channel protective layer has a function as the existing passivation film, the structure becomes simpler than the existing structure.

According to an embodiment of the invention, there is provided a method of manufacturing a thin film transistor including the steps of forming a gate electrode and a gate insulating film in this order on a substrate; forming an oxide semiconductor thin film layer having a channel region correspondingly to the gate electrode; patterning a channel protective layer including a first channel protective layer on a lower layer side and a second channel protective layer on an upper layer side in at least a region corresponding to the channel region on the gate insulating film and the oxide semiconductor thin film layer and thereby forming a contact hole for obtaining electrical connection with the oxide semiconductor thin film layer; and forming a source/drain electrode on the channel protective layer and the contact hole. Further, an oxide insulating material is used as the first channel protective layer, and a low oxygen permeable material is used as at least one of the first channel protective layer and the second channel protective layer.

In the method of manufacturing a thin film transistor according to the embodiment of the invention, the first channel protective layer is formed by using the oxide insulating material, and at least one of the first channel protective layer and the second channel protective layer is formed by using the low oxygen permeable material. Thereby, oxygen detachment from the oxide semiconductor thin film layer is inhibited. Further, since the source/drain electrode is formed after forming the channel protective layer, oxygen detachment from the oxide semiconductor thin film layer is inhibited at the time of forming the source/drain electrode as well. Furthermore, since the channel protective layer has a function as the existing passivation film, the manufacturing steps become simpler than the existing manufacturing steps.

According to the thin film transistor, the display unit, and the method of manufacturing a thin film transistor of the embodiments of the invention, the channel protective layer that includes the first channel protective layer on the lower layer side and the second channel protective layer on the upper layer side is provided. Thus, at the time of forming the channel protective layer and the source/drain electrode, oxygen detachment from the oxide semiconductor thin film layer is able to be inhibited, and a leakage current is able to be decreased. Further, since the channel protective layer has a function as the existing passivation film, the structure and the manufacturing steps become simpler than the existing structure and the existing manufacturing steps. Thus, in the thin film transistor including the oxide semiconductor thin film layer, reliability is able to be improved with the use of a simple structure.

Other and further objects, features and advantages of the invention will appear more fully from the following description.

BRIEF DESCRIPTION OF THE DRAWINGS

FIG. 19A is an elevation view of a fifth application example unclosed, FIG. 19B is a side view thereof, FIG. 19C is an elevation view of the fifth application example closed, FIG. 19D is a left side view thereof, FIG. 19E is a right side view thereof, FIG. 19F is a top view thereof, and FIG. 19G is a bottom view thereof.

DETAILED DESCRIPTION OF THE PREFERRED EMBODIMENTS

Embodiments of the invention will be hereinafter described in detail with reference to the drawings. The description will be given in the following order:
1. First embodiment (example that a channel protective layer has a two-layer structure)
2. Second embodiment (example that a hole (aperture) for supplying oxygen to an oxide semiconductor thin film layer is provided)
3. Module and application examples 1. First Embodiment (Structural Example of Display Unit)

Figure 1:
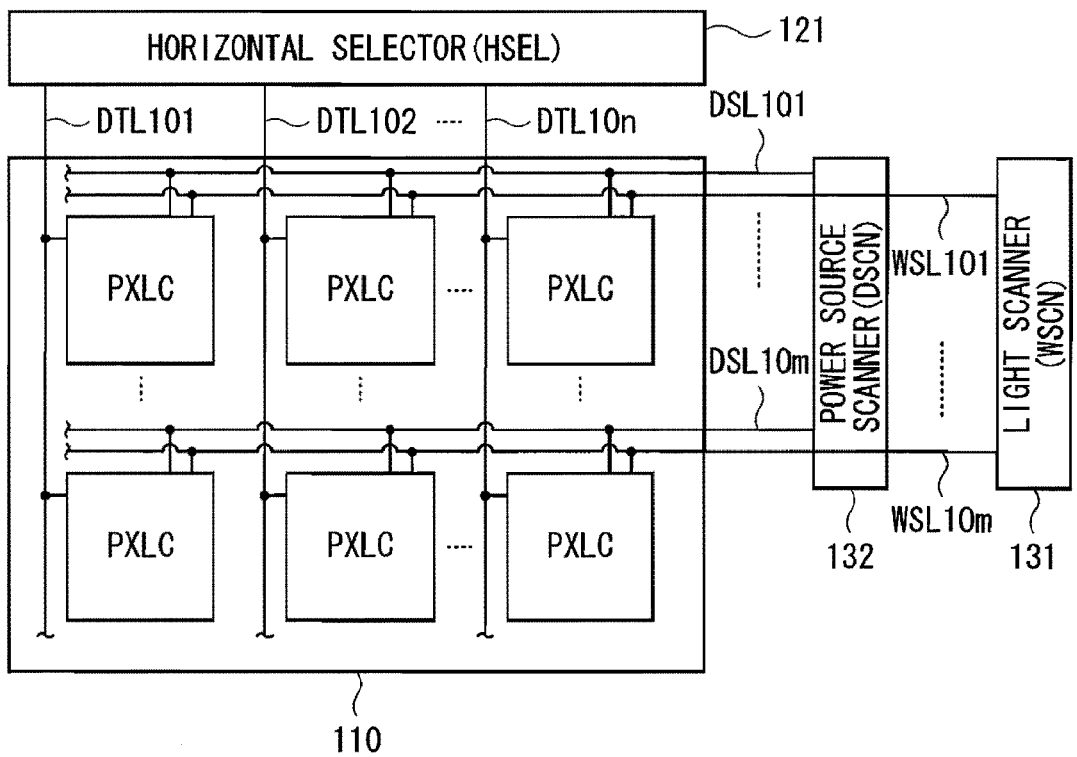
FIG. 1 is a diagram illustrating a structure of a display unit according to a first embodiment of the invention.

FIG. 1 illustrates a structure of a display unit according to a first embodiment of the invention. The display unit is used as an ultrathin organic light emitting color display unit or the like. In the display unit, for example, a display region 110 in which pixels PXLCs composed of a plurality of organic light emitting devices 10R, 10G, and 10B described later are arranged in a matrix state as a display device is formed in a TFT substrate 1. On the circumference of the display region 110, a horizontal selector (HSFL) 121 as a signal section, and a light scanner (WSCN) 131 and a power source scanner (DSCN) 132 as a scanner section are formed.

In the display region 110, signal lines DTL 101 to DTL 10n are arranged in the column direction, and scanning lines WSL 101 to WSL 10m and power source lines DSL 101 to DSL 10m are arranged in the row direction. A pixel circuit 140 including the organic light emitting device PXLC (one of 10R, 10G, and 10B (sub pixel)) is provided at each cross section between each signal line DTL and each scanning line WSL. Each signal line DTL is connected to the horizontal selector 121. A video signal Sig is supplied from the horizontal selector 121 to the signal line DTL. Each scanning line WSL is connected to the light scanner 131. Each power source line DSL is connected to the power source line scanner 132.

Figure 2:
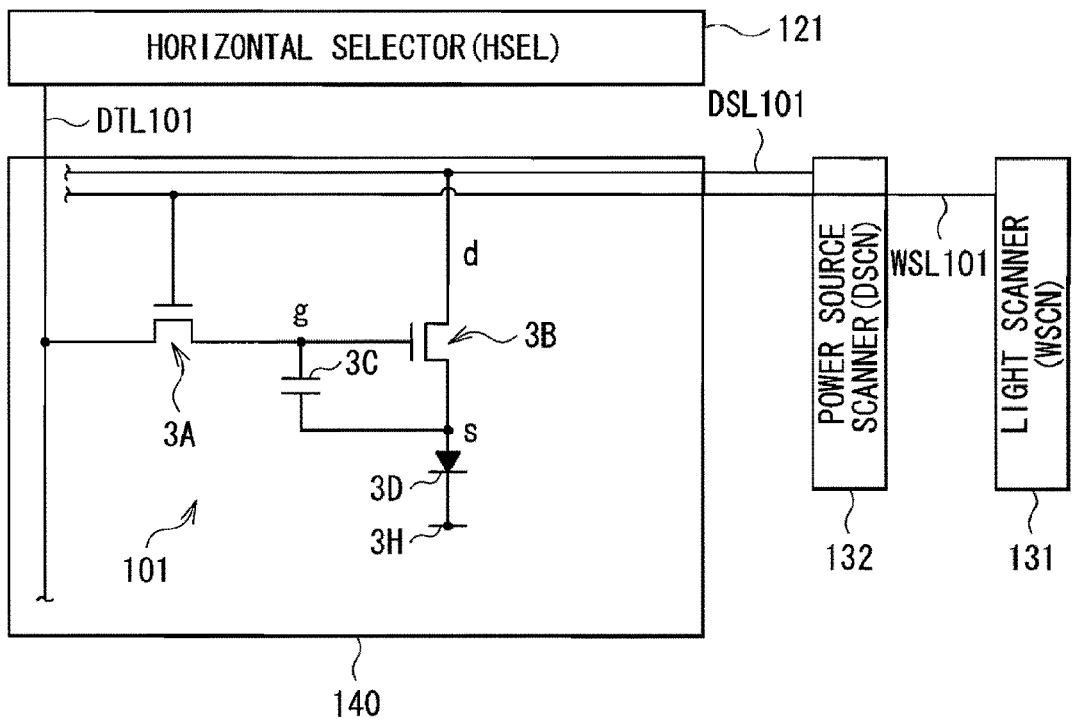
FIG. 2 is an equivalent circuit diagram illustrating an example of the pixel drive circuit illustrated in FIG. 1.

FIG. 2 illustrates an example of the pixel circuit 140. The pixel circuit 140 is an active drive circuit having a sampling transistor 3A, a drive transistor 3B, a retentive capacity 3C, and a light emitting device 3D composed of the organic light emitting device PXLC. In the sampling transistor 3A, its gate is connected to the corresponding scanning line WSL 101, one of its source and its drain is connected to the corresponding signal line DTL 101, and the other thereof is connected to a gate "g" of the drive transistor 3B. In the drive transistor 3B, its drain "d" is connected to the corresponding power source line DSL101, and its source s is connected to an anode of the light emitting device 3D. A cathode of the light emitting device 3D is connected to a ground link 3H. The ground link 3H is commonly wired to all pixels PXLCs. The retentive capacity 3C is connected between the source s and the gate g of the drive transistor 3B.

The sampling transistor 3A makes conduction in accordance with a control signal supplied from the scanning line WSL101, performs sampling of a signal potential of a video signal supplied from the signal line DTL101, and retains the result into the retentive capacity 3C. The drive transistor 3B receives a current supply from the power source line DSL101 in the first potential, and supplies a drive current to the light emitting device 3D in accordance with the signal potential retained in the retentive capacity 3C. The light emitting device 3D emits light at luminance in accordance with the signal potential of the video signal by the supplied drive current.

(Structural Example of TFT)

Figure 3:
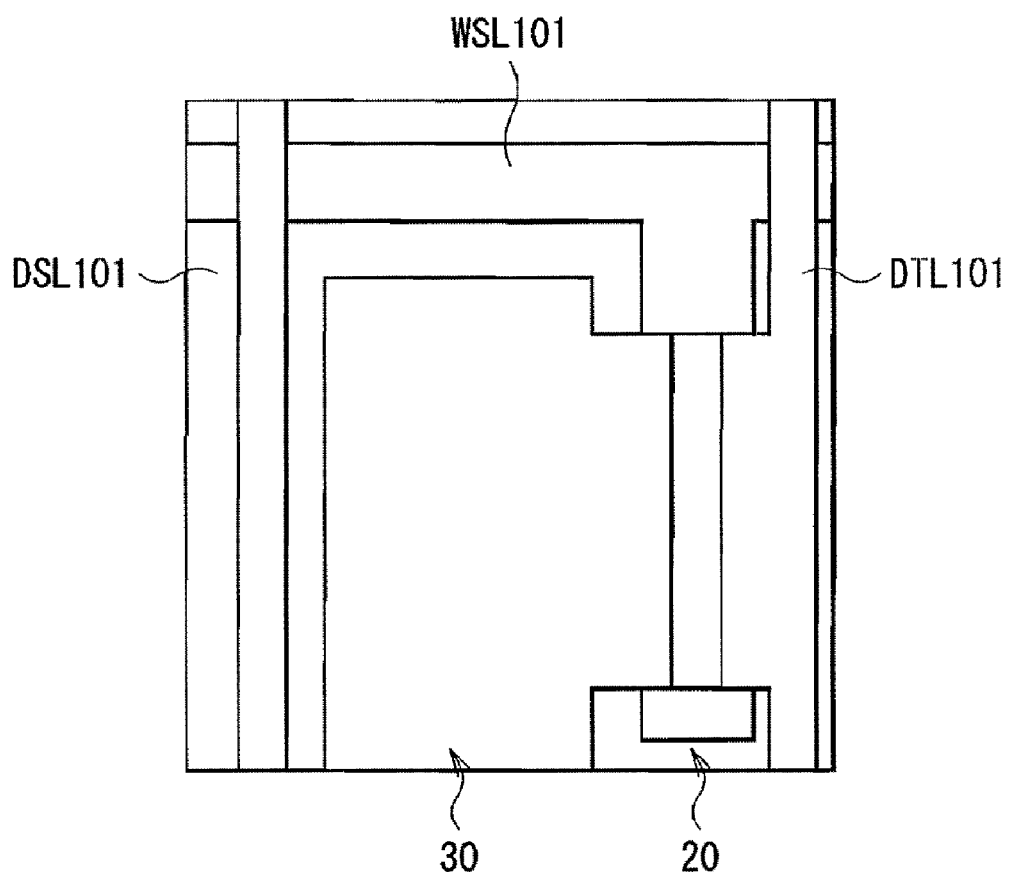
FIG. 3 is a plan view illustrating a structure of part of the pixel drive circuit of the TFT substrate illustrated in FIG. 2.

FIG. 3 illustrates a planar structure of part of the pixel drive circuit 140 of the TFT substrate 1 (section corresponding to the sampling transistor 3A and the retentive capacity 3C of FIG. 2). In the TFT substrate 1, for example, a TFT 20 composing the foregoing sampling transistor 3A and a capacitor 30 composing the foregoing retentive capacity 3C are formed on the substrate 10 made of glass or the like. Though omitted in FIG. 3, the drive transistor 3B of FIG. 2 is composed similarly to the TFT20.

Figure 4:
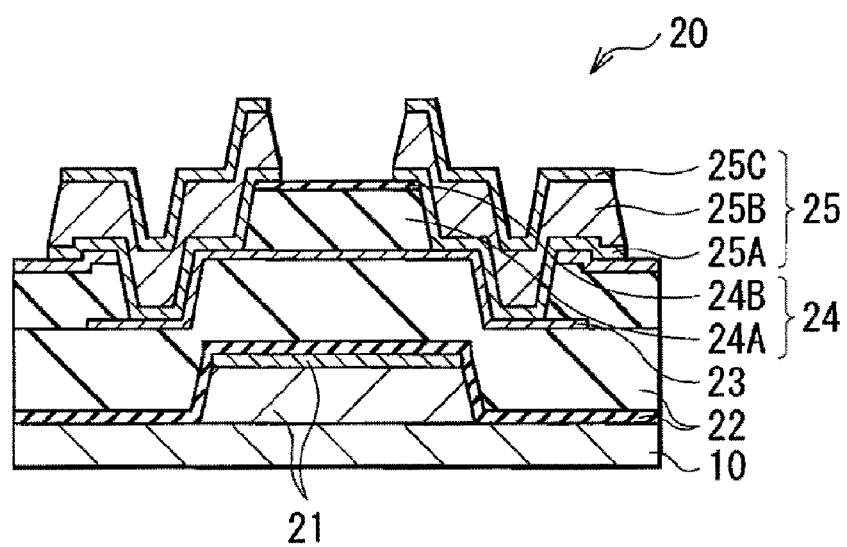
FIG. 4 is a cross sectional view illustrating a structure of the TFT illustrated in FIG. 3.

FIG. 4 illustrates a cross sectional structure of the TFT 20 illustrated in FIG. 3. The TFT 20 is a bottom gate oxide semiconductor transistor sequentially having, for example, a gate electrode 21, a gate insulating film 22, an oxide semiconductor thin film layer 23, a channel protective layer 24, and a source/drain electrode 25. The oxide semiconductor represents an oxide of zinc, indium, gallium, tin, or a mixture thereof, and is known to show superior semiconductor characteristics.

Figure 5:
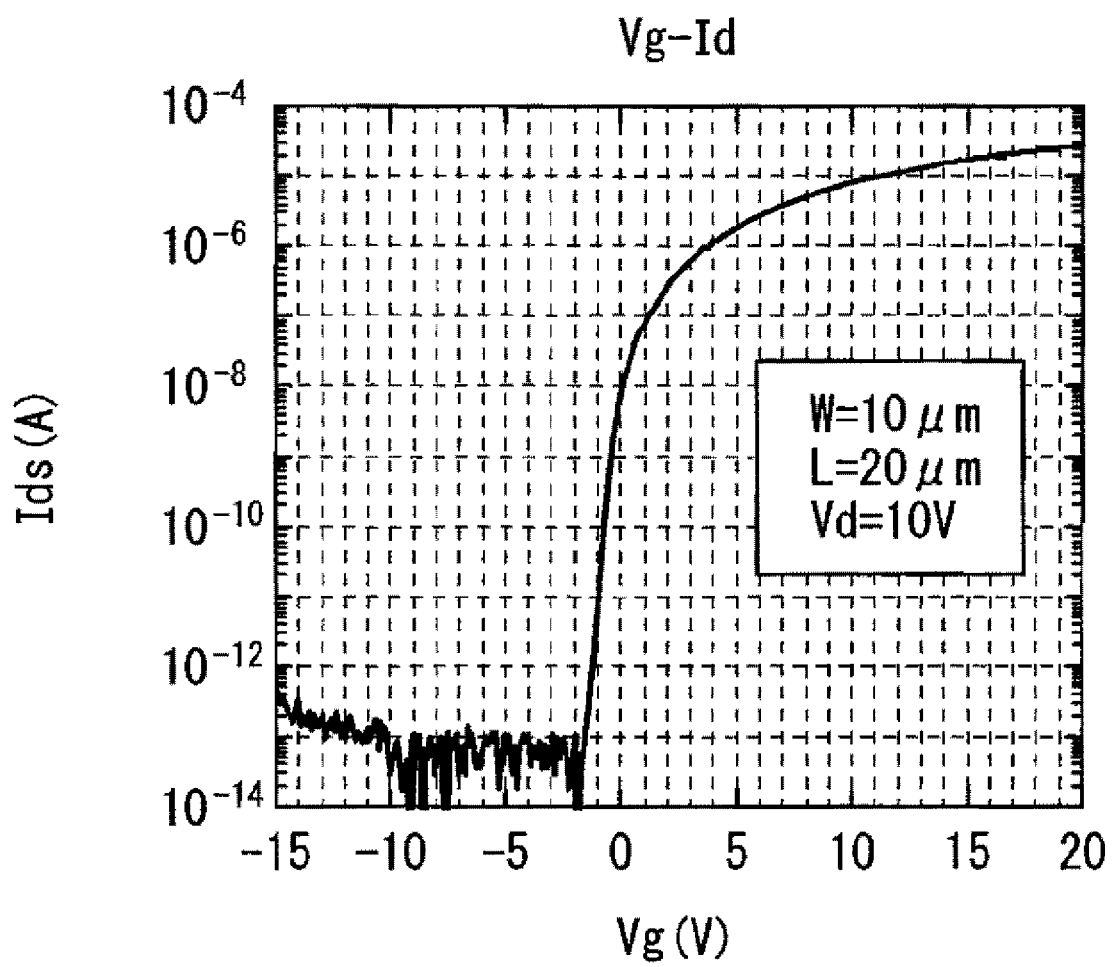
FIG. 5 is a diagram illustrating characteristics of a TFT including an oxide semiconductor.

FIG. 5 illustrates current voltage characteristics of an oxide semiconductor TFT composed of, for example, a mixed oxide of zinc, indium, and gallium (indium gallium zinc oxide: IGZO). The oxide semiconductor shows electron mobility from ten times to a hundred times as large as that of the amorphous silicon that has been used as a semiconductor in the past and shows favorable off-characteristics. Further, in the oxide semiconductor, the resistivity is from hundredth part to tenth part of that of the existing amorphous silicon. In addition, in the oxide semiconductor, the threshold voltage is able to be easily set low, for example, 0 V or less.

The gate electrode 21 controls electron density in the oxide semiconductor thin film layer 23 by a gate voltage applied to the TFT 20. The gate electrode 21 has, for example, a two-layer structure composed of a molybdenum (Mo) layer having a thickness of 50 nm and an aluminum (Al) layer or an aluminum alloy layer having a thickness of 400 nm.

The gate insulating film 22 has, for example, a two-layer structure composed of a silicon oxide film having a thickness of 200 nm and a silicon nitride film having a thickness of 200 nm.

The oxide semiconductor thin film layer 23 has, for example, a thickness of 50 nm, and is composed of indium gallium zinc oxide (IGZO). In the oxide semiconductor thin film layer 23, a channel region (not illustrated) is formed correspondingly to the gate electrode 21. The oxide semiconductor thin film layer 23 is patterned in the shape of an island (not illustrated).

The channel protective layer 24 is formed at least in a region corresponding to the channel region in the oxide semiconductor thin film layer 23. The channel protective layer 24 has a two-layer structure composed of a first channel protective layer 24A and a second channel protective layer 24B that are sequentially layered from the substrate 10 side.

The first channel protective layer 24A is a layer that makes an oxygen amount detached from the oxide semiconductor thin film layer 23 small (desirably a layer that does not detach oxygen from the oxide semiconductor thin film layer 23), or a layer that supplies a small amount of hydrogen to the oxide semiconductor thin film layer 23 (desirably a layer that does not supply hydrogen to the oxide semiconductor thin film layer 23). The first channel protective layer 24A has, for example, a thickness of 200 nm, and is made of an oxide insulator material (for example, silicon oxide, tantalum oxide, titanium oxide, hafnium oxide, zirconium oxide, yttrium oxide, aluminum oxide, a nitrogenous material thereof or the like). To realize the first channel protective layer 24A that supplies a small amount of hydrogen as described above, the first channel protective layer 24A desirably has the hydrogen concentration in the film of about $10^{21}$ ($cm^{-3}$) or less. As the first channel protective layer 24A, a silicon nitride film may be used as long as the silicon nitride film is a film that is formed by sputtering method and has a small oxygen content.

The second channel protective layer 24B is a film having oxygen passivation effect to make oxygen hardly detached in a heat step after forming the second channel protective layer 24B. Further, the second channel protective layer 24B has passivation effect to prevent moisture intrusion from outside. The second channel protective layer 24B has, for example, a thickness of 100 nm, and is made of a material having low oxygen permeability and low water vapor permeability (for example, oxygen permeability factor of detection limit of Mocon method (0.1 ($cc/m^2$ day) or less and water vapor permeability factor of 0.1 ($g/m^2$ day) or less) (for example, silicon nitride, silicon oxynitride, aluminum oxide or the like). In the case where an aluminum oxide film is used as the first channel protective layer 24A, the first channel protective layer 24A has oxygen passivation effect. Thus, a silicon oxide film is able to be used as the second channel protective layer 24B.

Even in the case where the first channel protective layer 24A does not detach oxygen from the oxide semiconductor thin film layer 23 (condition A), does not supply hydrogen to the oxide semiconductor thin film layer 23 (condition B), does not pass oxygen (condition C), and does not pass water vapor (condition D), it is necessary to provide the second channel protective layer 24B. That is, the channel protective layer 24 in this embodiment has a two-layer structure composed of the first channel protective layer 24A and the second channel protective layer 24B. The second channel protective layer 24B is provided in addition to the first channel protective layer 24A for the following reason. First, in the off-region in the TFT 20, the capacity component of the channel protective layer 24 is added to a parasitic capacity formed between the source/drain electrode 25 and the gate electrode 21. Thus, to make the parasitic capacity small, it is necessary to increase the film thickness of the channel protective layer 24 as much as possible to decrease the capacity component of the channel protective layer 24. Therefore, in the case where the first channel protective layer 24A satisfies the foregoing all conditions A to D, the material and the film thickness of the second channel protective layer 24B are selected while paying attention to the foregoing parasitic capacity or the pattern shape of the channel protective layer 24. Further, for the purpose of decreasing the parasitic capacity or for the purpose of keeping the pattern shape of the channel protective layer 24 favorable, the channel protective layer 24 may have a structure composed of three or more layers.

Further, the channel protective layer 24 also functions as a passivation layer. Thus, it is beneficial that the channel protective layer 24 is left on a section other than the channel formation section, for example, on a gate wiring. As illustrated in FIG. 4, it is desirable to pattern only the formation section of the source/drain electrode 25.

The source/drain electrode 25 has a laminated structure composed of, for example, a titanium layer 25A having a thickness of 50 nm, an aluminum layer 25B having a thickness of 90 nm, and a titanium layer 25C having a thickness of 50 nm. The source/drain electrode 25 is electrically connected to the oxide semiconductor thin film layer 23 through a contact hole.

(Example of Cross Sectional Structure of Display Region)

Figure 6:
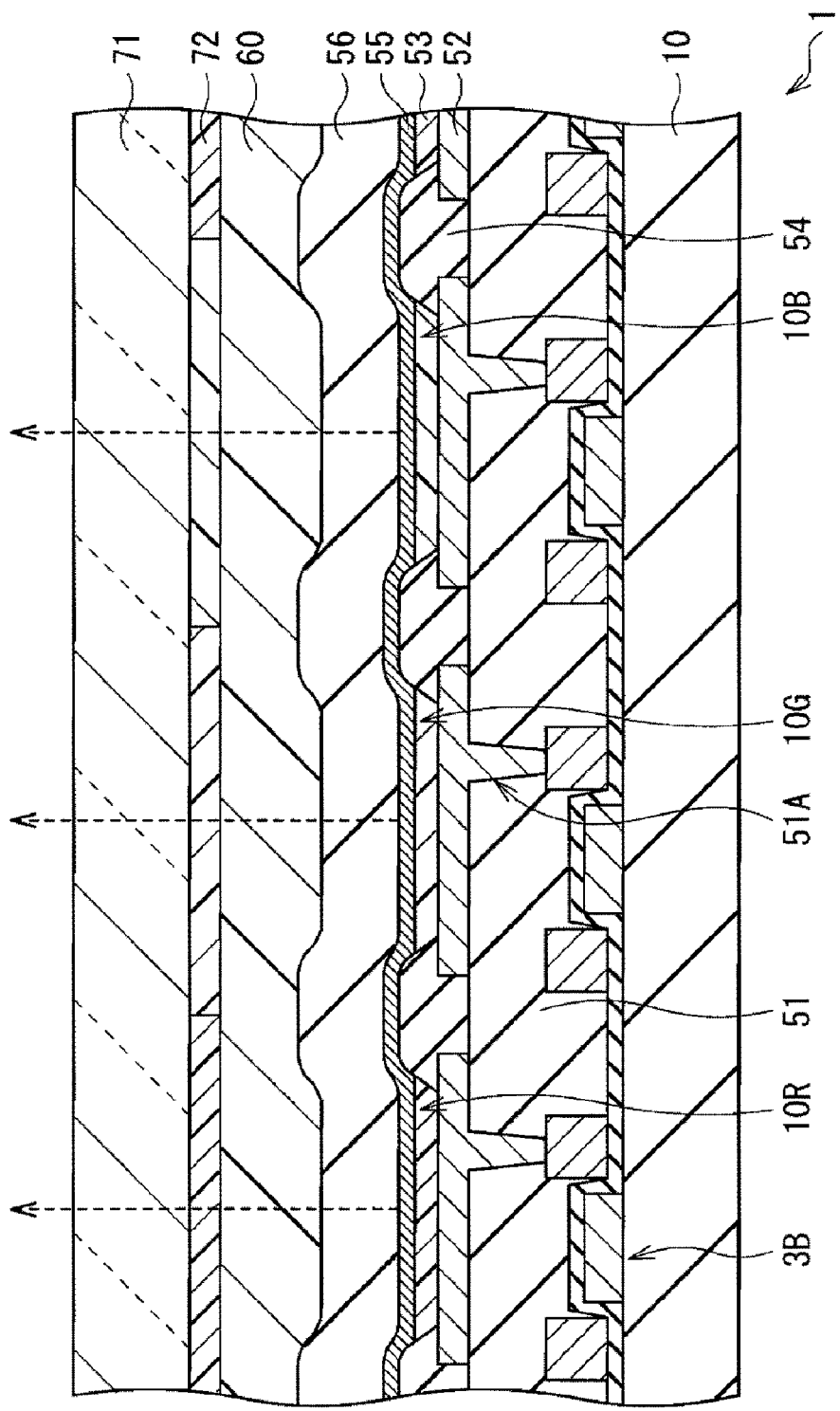
FIG. 6 is a cross sectional view illustrating a structure of the display region illustrated in FIG. 1.

FIG. 6 illustrates a cross sectional structure of the display region 110 illustrated in FIG. 1. In the display region 110, the organic light emitting device 10R generating red light, the organic light emitting device 10G generating green light, and the organic light emitting device 10B generating blue light are sequentially formed in a matrix state as a whole. The organic light emitting devices 10R, 10G, and 10B have a reed-like planar shape, and a combination of the organic light emitting devices 10R, 10G, and 10B adjacent to each other composes one pixel.

The organic light emitting devices 10R, 10G, and 10B respectively have a structure in which an anode 52, an interelectrode insulating film 53, an organic layer 54 including an after-mentioned light emitting layer, and a cathode 55 are layered in this order over the TFT substrate 1 with a planarizing insulating film 51 in between.

The organic light emitting devices 10R, 10G, and 10B as above are coated with a protective film 56 composed of silicon nitride (SiN), silicon oxide (SiO) or the like according to needs. Further, a sealing substrate 71 made of glass or the like is bonded to the whole area of the protective film 55 with an adhesive layer 60 made of a thermoset resin, an ultraviolet cure resin or the like in between, and thereby the organic light emitting devices 10R, 10G, and 10B are sealed. The sealing substrate 71 may be provided with a color filter 72 and a light shielding film (not illustrated) as a black matrix according to needs.

The planarizing insulating film 51 is intended to planarize a front face of the TFT substrate 1 over which the pixel drive circuit 140 is formed. Since the fine connection hole 51A is formed in the planarizing insulating film 51, the planarizing insulating film 51 is preferably made of a material having favorable pattern precision. Examples of component materials of the planarizing insulating film 51 include an organic material such as polyimide and an inorganic material such as silicon oxide ($SiO_2$). The drive transistor 3B illustrated in FIG. 2 is electrically connected to the anode 52 through the connection hole 51A provided in the planarizing insulating film 51. Further, though omitted in FIG. 6, a lower electrode 31 of the capacitor 30 composing the retentive capacity 3C is also electrically connected to the anode 52 through a connection hole (not illustrated) provided in the planarizing insulating film 51.

The anode 52 is formed correspondingly to the respective organic light emitting devices 10R, 10G, and 10B. Further, the anode 52 has a function as a reflecting electrode to reflect light generated in the light emitting layer, and desirably has high reflectance as much as possible in order to improve light emitting efficiency. The anode 52 has, for example, a thickness from 100 nm to 1000 nm both inclusive. The anode 52 is composed of a simple substance or an alloy of a metal element such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), and gold (Au).

The interelectrode insulating film 53 is intended to secure insulation between the anode 52 and the cathode 55, and to accurately obtain a desired shape of the light emitting region. For example, the interelectrode insulating film 53 is made of an organic material such as polyimide or an inorganic insulating material such as silicon oxide (SiO2). The interelectrode insulating film 53 has apertures correspondingly to the light emitting region of the anode 52. The organic layer 54 and the cathode 55 may be also provided continuously on the interelectrode insulating film 53 in addition to on the light emitting region, but light is emitted only in the aperture of the interelectrode insulating film 53.

The organic layer 54 has, for example, a structure in which an electron hole injection layer, an electron hole transport layer, the light emitting layer, and an electron transport layer (not illustrated) are layered in this order from the anode 52 side. Of the foregoing layers, the layers other than the light emitting layer may be provided according to needs. Further, the organic layer 54 may have a structure varying according to the light emitting color of the organic light emitting devices 10R, 10G, 10B. The electron hole injection layer is intended to improve the electron hole injection efficiency and functions as a buffer layer to prevent leakage. The electron hole transport layer is intended to improve efficiency to transport electrons into the light emitting layer. The light emitting layer is intended to generate light due to electron-hole recombination by impressing an electric field. The electron transport layer is intended to improve efficiency to transport electrons into the light emitting layer. Component materials of the organic layer 54 are not particularly limited as long as the component materials are a general low molecular organic material or a general high molecular organic material.

The cathode 55 has, for example, a thickness from 5 nm to 50 nm both inclusive, and is composed of a simple substance or an alloy of metal elements such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. Further, the cathode 55 may be composed of ITO (indium tin composite oxide) or IZO (indium zinc composite oxide).

The display unit is able to be manufactured, for example, as follows.

(Step of Forming TFT Substrate 1)

Figure 7:
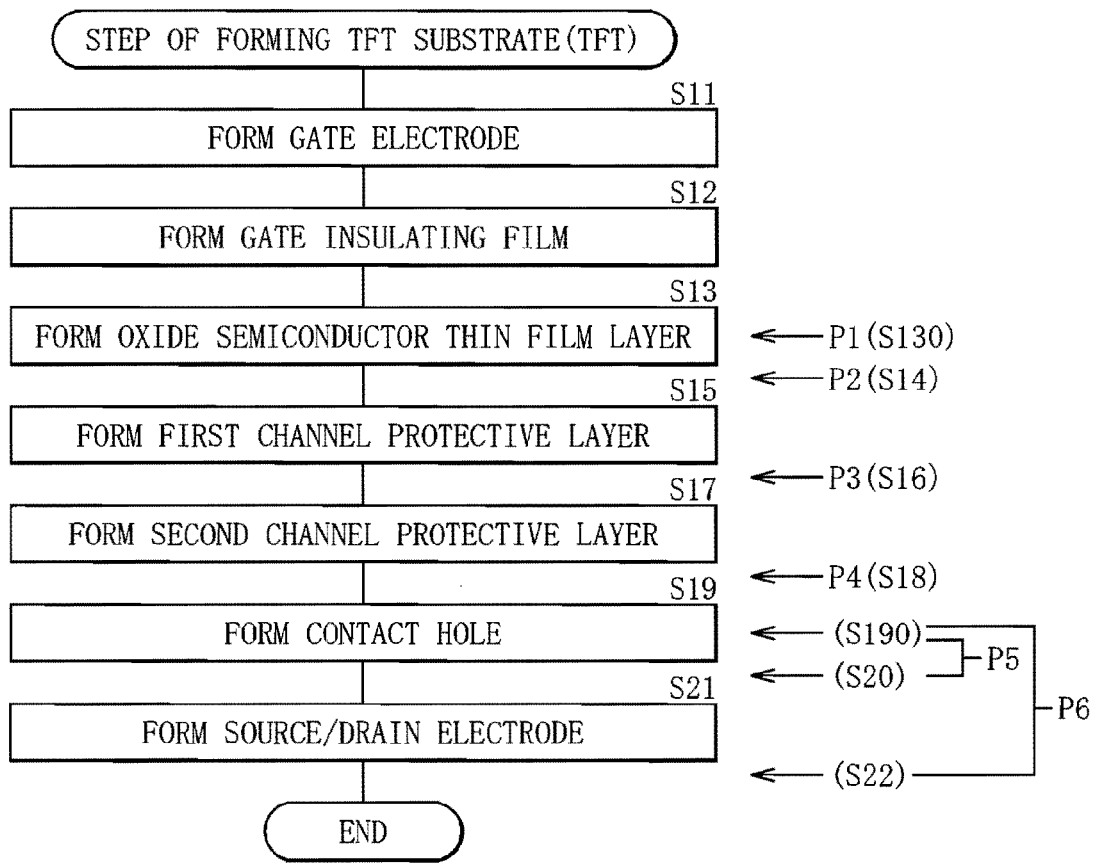
FIG. 7 is a flowchart illustrating an example of steps of forming the TFT substrate (TFT) illustrated in FIG. 3 and FIG. 4.

FIG. 7 illustrates an example of steps of forming the TFT substrate 1 (TFT 20).

First, a two-layer structure composed of a molybdenum (Mo) layer having a thickness of 50 nm and an aluminum (Al) layer or an aluminum alloy layer having a thickness of 400 nm is formed on the substrate 10 made of glass by, for example, sputtering method. Next, the gate electrode 21 is formed by providing photolithography and etching for the two-layer structure (step S11 of FIG. 7).

Subsequently, a two-layer structure composed of a silicon oxide film having a thickness of 200 nm and a silicon nitride film having a thickness of 200 nm is formed on the whole area of the substrate 10 by, for example, CVD method. Thereby the gate insulating film 22 is formed (step S12).

After that, an indium gallium zinc oxide (IGZO) film having a thickness of 50 nm is formed by, for example, sputtering method, and the film is formed into a given shape by photolithography and etching. Thereby the oxide semiconductor thin film layer 23 is formed (step S13).

After the oxide semiconductor thin film layer 23 is formed, a silicon oxide film having a thickness of 200 nm to become the first channel protective layer 24A is formed by, for example, CVD method (step S15). At this time, the composition of deposition gas preferably does not contain hydrogen. Instead of the silicon oxide film formed by CVD method, a silicon oxide film, a silicon nitride film, or an oxide aluminum film formed by sputtering method or an aluminum oxide film by atomic layer deposition (ALD) method may be formed.

Subsequently, a silicon nitride film having a thickness of 100 nm to become the second channel protective layer 24B is formed by, for example, CVD method (step S17). At this time, the composition of deposition gas preferably does not contain hydrogen. Instead of the silicon nitride film formed by CVD method, a silicon nitride film or an aluminum oxide film formed by sputtering method or an aluminum oxide film formed by atomic layer deposition (ALD) method may be formed.

The first channel protective layer 24A functions as a protective film at the time of forming the TFT 20. Thus, the first channel protective layer 24A may be formed immediately after forming the oxide semiconductor thin film layer 23. In this case, the oxide semiconductor thin film layer 23 and the first channel protective layer 24A are formed into the same shape by a photolithography step and an etching step.

Subsequently, the silicon nitride film is formed into a given shape by photolithography and etching to form a contact hole to the oxide semiconductor thin film layer 23 (step S19). Thereby, the channel protective layer 24 composed of the first channel protective layer 24A and the second channel protective layer 24B in the shape illustrated in FIG. 3 are formed. At this time, the channel protective layer 24 also functions as a passivation layer. Thus, it is beneficial that the channel protective layer 24 is left on a section other than the channel formation section, for example, on a gate wiring. As illustrated in FIG. 4, it is desirable to pattern only the formation section of the source/drain electrode 25. In this step, a contact hole to the gate electrode 21 may be provided in a region where the oxide semiconductor thin film layer 23 does not exist.

Subsequently, the titanium layer 25A having a thickness of 50 nm, the aluminum layer 25B having a thickness of 900 nm, and the titanium layer 25C having a thickness of 50 nm are formed by, for example, sputtering method. After that, the titanium layer 25A, the aluminum layer 25B, and the titanium layer 25C are respectively formed into a given shape by photolithography and etching. Thereby, the source/drain electrode 25 is formed (step S21). Accordingly, the TFT substrate 1 illustrated in FIG. 3 and FIG. 4 is formed.

(Step of Forming Organic Light Emitting Devices 10R, 10G, and 10B)

First, the whole area of the TFT substrate 1 is coated with a photosensitive resin, and exposure and development are performed. Thereby, the planarizing insulating film 51 and the connection hole 51A are formed and fired. Next, the anode 52 made of the foregoing material is formed by, for example, direct current sputtering. The resultant film is selectively etched and patterned into a given shape by, for example, using lithography technology. Subsequently, the interelectrode insulating film 53 that has the foregoing thickness and is made of the foregoing material is formed by, for example, CVD method, and an aperture is formed by using, for example, lithography technology. After that, the organic layer 54 and the cathode 55 that are made of the foregoing materials are sequentially formed by, for example, evaporation method to form the organic light emitting devices 10R, 10G, and 10B. Subsequently, the organic light emitting devices 10R, 10G, and 10B are covered with the protective film 56 made of the foregoing material.

After that, the adhesive layer 60 is formed on the protective film 56. After that, the sealing substrate 71 that is provided with the color filter 72 and is made of the foregoing material is prepared. The TFT substrate 1 and the sealing substrate 71 are bonded with each other with the adhesive layer 60 in between. Accordingly, the display unit illustrated in FIG. 6 is completed.

Figure 9:
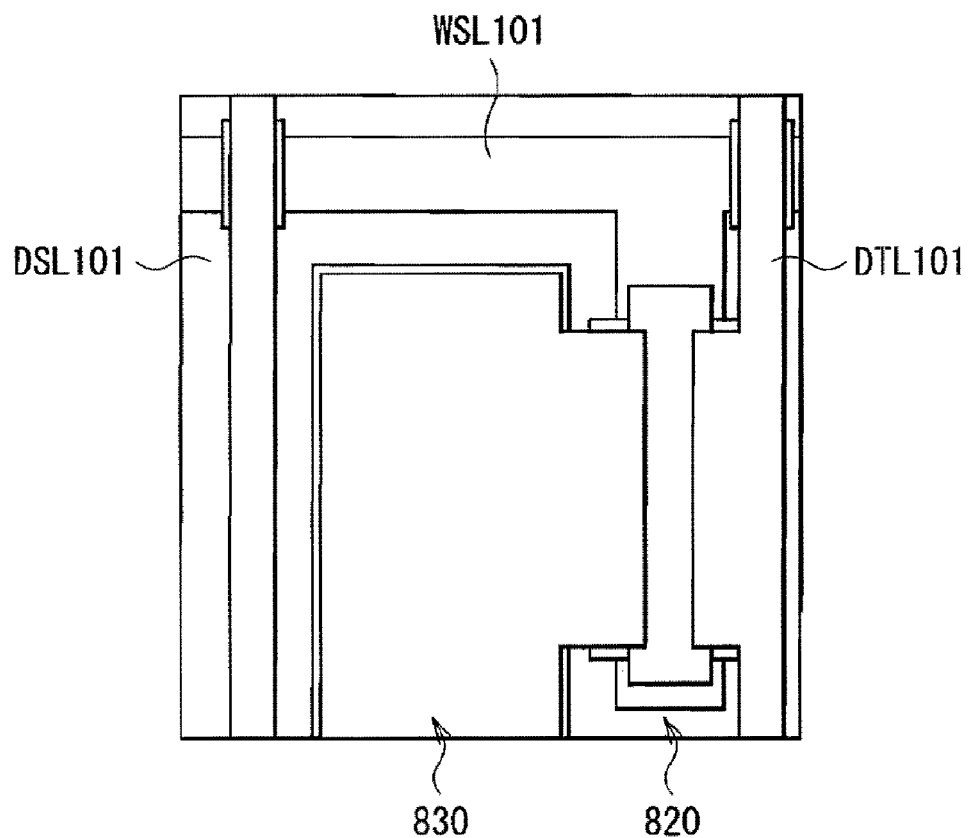
FIG. 9 is a plan view illustrating a structure of part of a pixel drive circuit of a TFT substrate according to a first comparative example.
Figure 10:
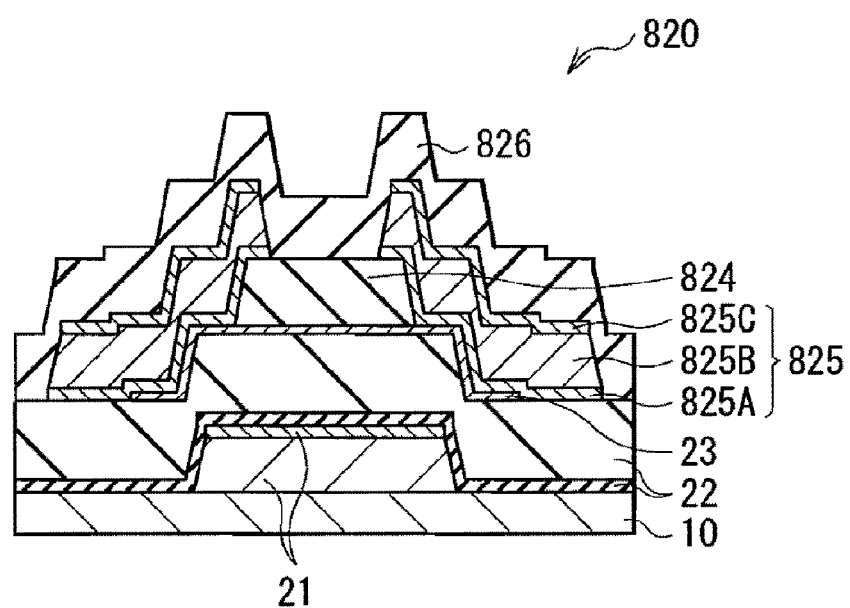
FIG. 10 is a cross sectional view illustrating a structure of the TFT illustrated in FIG. 9.
Figure 11:
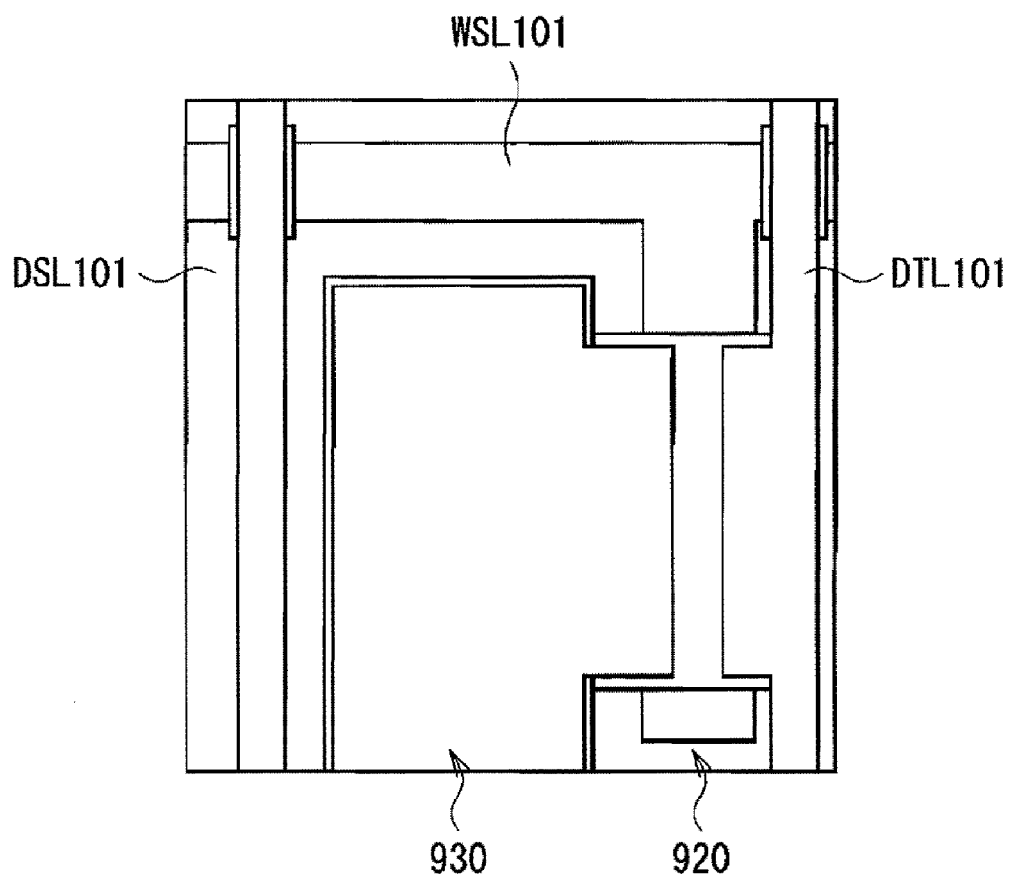
FIG. 11 is a plan view illustrating a structure of part of a pixel drive circuit of a TFT substrate according to a second comparative example.
Figure 12:
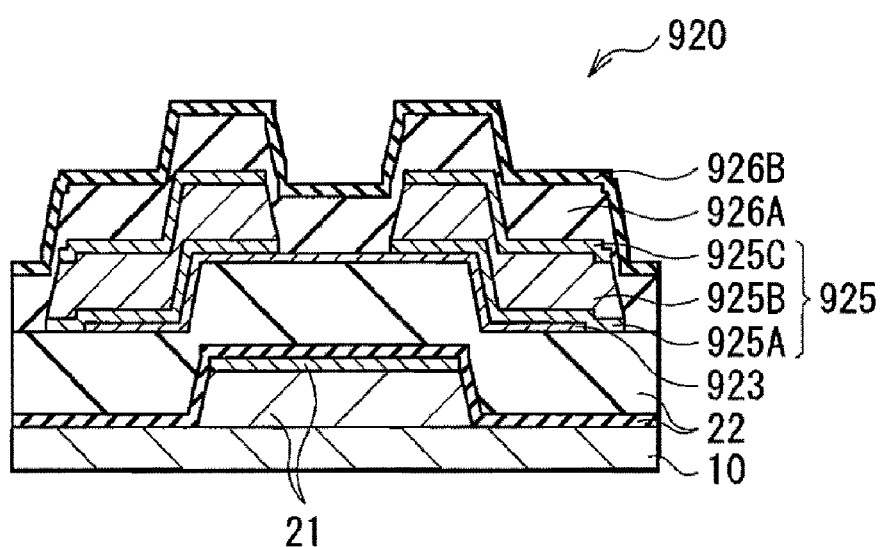
FIG. 12 is a cross sectional view illustrating a structure of the TFT illustrated in FIG. 11.

Next, a description will be given of action and effect of the display unit of this embodiment by comparison with comparative examples. FIG. 9 illustrates a planar structure of part of a pixel drive circuit of a TFT substrate according to a first comparative example. FIG. 10 illustrates a cross sectional structure of a TFT 820 illustrated in FIG. 9. Further, FIG. 11 illustrates a planar structure of part of a pixel drive circuit of a TFT substrate according to a second comparative example. FIG. 12 illustrates a cross sectional structure of a TFT 920 illustrated in FIG. 11. In FIG. 9 and FIG. 10, elements corresponding to the elements of FIG. 3 and FIG. 4 are affixed with a number obtained by adding 800 to the elements of FIG. 3 and FIG. 4. Further, in FIG. 11 and FIG. 12, elements corresponding to the elements of FIG. 3 and FIG. 4 are affixed with a number obtained by adding 900 to the elements of FIG. 3 and FIG. 4.

In this display unit, the sampling transistor 3A makes conduction in accordance with a control signal supplied from the scanning line WSL, and a signal potential of a video signal supplied from the signal line DTL is sampled and retained in the retentive capacity 3C. Further, a current is supplied from the power source line DSL in the first potential to the drive transistor 3B, and a drive current is supplied to the light emitting device 3D (organic light emitting devices 10R, 10G, and 10B) in accordance with the signal potential retained in the retentive capacity 3C. The light emitting device 3D (organic light emitting devices 10R, 10G, and 10B) emits light at luminance corresponding to the signal potential of the video signal by the supplied drive current. The light is transmitted through the cathode 55, the color filter 72, and the sealing substrate 71 and is extracted.

Figure 8:
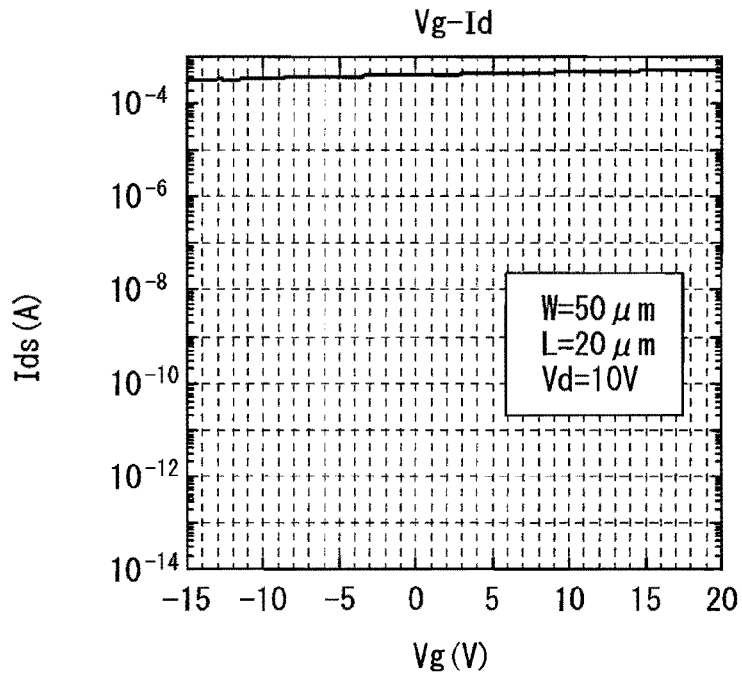
FIG. 8 is a diagram for explaining influence of oxygen detachment of an oxide semiconductor on TFT operation.

In the oxide semiconductor, the heat resistance is not sufficient. Thus, due to heat treatment and plasma treatment in a manufacturing process of a TFT, oxygen is detached and lattice defect is formed. The lattice defect results in forming an electrically shallow impurity level, and causes low resistance of the oxide semiconductor. Thus, in the case where the oxide semiconductor is used for an active layer of the TFT, the defect level is increased, the threshold voltage is decreased, a leakage current is increased, resulting in depression type operation in which a drain current is flown without applying a gate current. If the defect level is sufficiently increased, as illustrated in FIG. 8, transistor operation is stopped to shift to semiconductor operation.

Thus, in the first comparative example illustrated in FIG. 9 and FIG. 10, a channel protective layer 824 is formed from a silicon oxide film, and a passivation film 826 is formed from a silicon nitride film. In this technique, to prevent oxygen detachment after forming an active layer, after forming the channel protective layer 824 by using silicon oxide immediately after forming the active layer, a source/drain electrode 825 (825A to 825C) is formed and patterned. As a thin film through which oxygen hardly passes, the passivation film 826 is formed by using the silicon nitride film.

However, in the technique of the first comparative example, two photolithography steps are necessitated to form both protective films (the channel protective layer 824 and the passivation film 826). Further, before forming the passivation film 826, at least three high temperature heat steps (forming the channel protective layer 824, forming the source/drain electrode layer 826, and forming the passivation layer 826) are performed. Thus, without whether or not oxygen detachment from the oxide semiconductor thin film layer 23 is generated, after forming the passivation film 826, due to existence of the passivation film 826 through which oxygen hardly passes, oxygen is hardly supplied to the oxide semiconductor thin film layer 23.

Meanwhile, in the second comparative example illustrated in FIG. 11 and FIG. 12, a channel protective layer is not formed. Further, a first passivation film 926A made of a silicon oxide film and a second passivation film 926B made of a silicon nitride film prevent oxygen from being detached in a step of forming passivation. Further, since the channel protective layer is not formed and a source/drain electrode 925 (925A to 925C) and the passivation films 926A and 926B are formed on the oxide semiconductor thin film layer 23, the steps are simplified.

However, in the technique of the second comparative example, oxygen detachment or the like is generated in a step of forming the source/drain electrode 925 and thus favorable transistor characteristics are not able to be obtained. That is, to restore the favorable transistor characteristics, it is necessary to resupply oxygen after forming the source/drain electrode 925.

Meanwhile, in this embodiment, the first channel protective layer 24A made of the oxide insulating material inhibits oxygen detachment from the oxide semiconductor thin film layer 23. Further, the second channel protective layer 24B made of the material having low oxygen permeability on the first channel protective layer 24A inhibits oxygen detachment from the oxide semiconductor thin film layer 23. In addition, since the source/drain electrode 25 is formed on the upper layer of the channel protective layer 24, oxygen detachment from the oxide semiconductor thin film layer 23 is inhibited at the time of forming the source/drain electrode 25 as well.

Further, since the channel protective layer 24 has a function as the existing passivation film, the structure is more simplified than the existing structure.

As described above, in this embodiment, the channel protective layer 24 composed of the first channel protective layer 24A on the lower layer side and the second channel protective layer 24B on the upper layer side is provided. Thus, at the time of forming the channel protective layer 24 and the source/drain electrode 25, oxygen detachment from the oxide semiconductor thin film layer 23 is able to be inhibited, and a leakage current is able to be decreased. Further, since the channel protective layer 24 has a function as the existing passivation film, the structure and the manufacturing steps are more simplified than the existing structure and the existing manufacturing steps. Therefore, in a thin film transistor including the oxide semiconductor thin film layer 23, reliability is able to be improved with a simple structure.

Specifically, in the existing channel protective film, under high temperature and vacuum conditions in sputtering at the time of forming the source/drain or at the time of generation of initial plasma, there is a possibility that oxygen detachment from the oxide semiconductor thin film layer around the channel protective film is generated and accordingly a weak leakage current is generated between the source electrode and the drain electrode. Meanwhile, in this embodiment, such a weak leakage current is able to be inhibited.

Further, in the display unit including such a TFT 20, an inexpensive and high-quality flat panel display is able to be realized.

2. Second Embodiment (Structural Example of TFT)

Figure 13A:
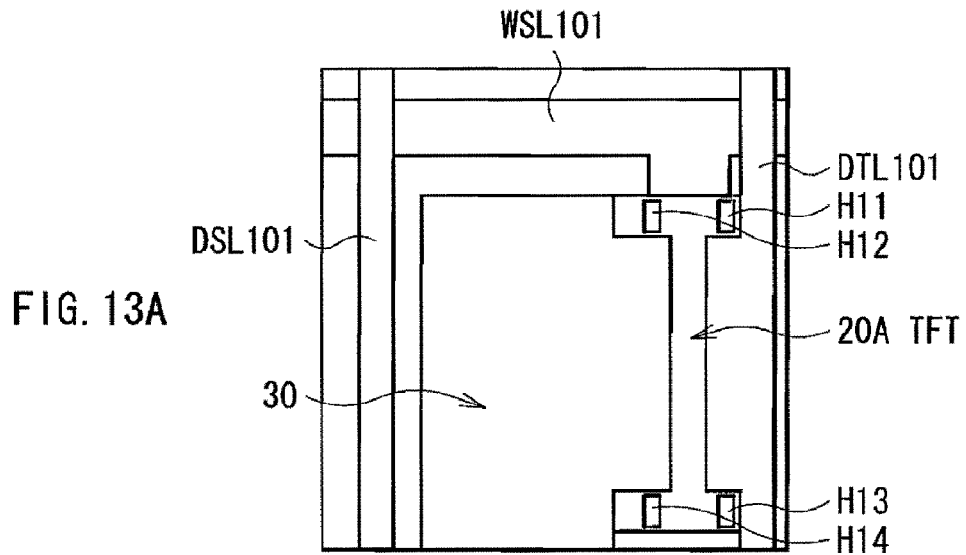
FIGS. 13A to 13C are plan views illustrating a structure of part of a pixel drive circuit of a TFT substrate according to a second embodiment of the invention.
Figure 13B:
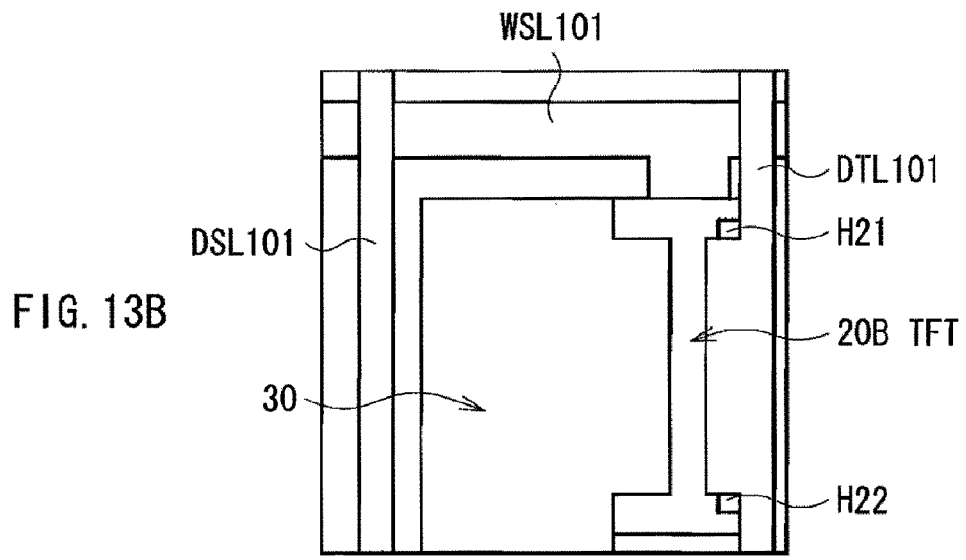
Figure 13C:
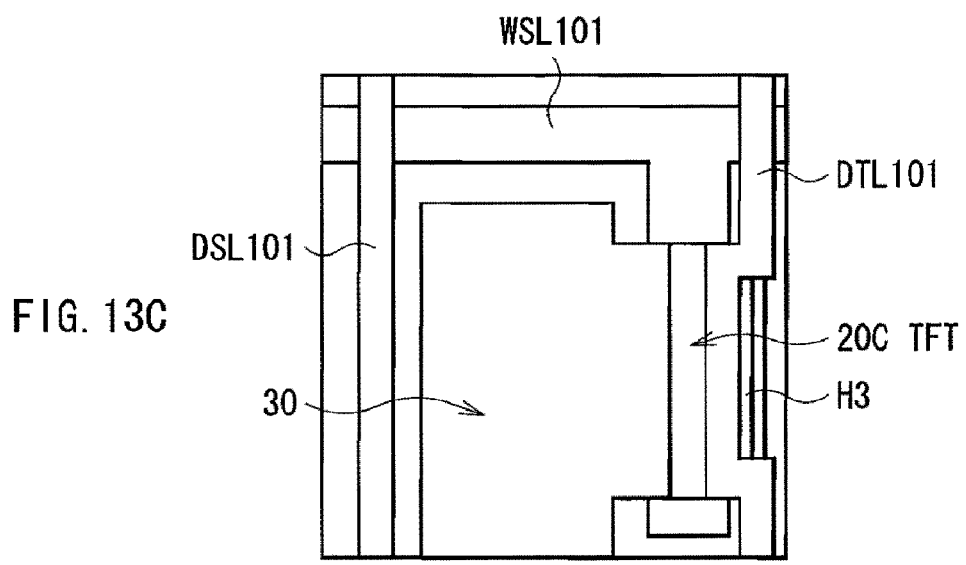

FIGS. 13A to 13C illustrate a planar structure of part of the pixel drive circuit 140 of the TFT substrate 1 according to a second embodiment of the invention (section corresponding to the sampling transistor 3A and the retentive capacity 3C of FIG. 2). This embodiment is totally the same as the foregoing first embodiment, except that a hole (aperture) described below is provided. Thus, a description will be given by affixing the same referential symbols to the corresponding elements.

First, in the foregoing first embodiment, in forming the TFT 20, at the time of forming the source/drain electrode 25, in some cases, there is a possibility that oxygen detachment from the oxide semiconductor thin film layer 23 is generated and the transistor characteristics are deteriorated.

Thus, in this embodiment, as in TFTs 20A to 20C illustrated in FIGS. 13A to 13C, at the time of pattering the channel protective layer 24 (at the time of forming the contact hole: step S19 of FIG. 7), holes (apertures) H11 to H14, H21, H22, and H3 penetrating to the oxide semiconductor thin film layer 23 are formed in the vicinity of the channel region in the channel protective layer 24.

Such a hole is preferably provided in the vicinity of the channel region (from 10 μm to 20 μm both inclusive apart from the channel region). Further, it is desirable that the hole is not arranged astride the section between the source electrode 25 and the drain electrode 25 for the following reason. That is, such a hole may cause oxygen detachment in the subsequent steps. If the oxygen detachment is generated and the oxide semiconductor thin film layer 23 becomes an electric conductor, a region with a lower resistance than that of the channel region is prevented from being formed between the source electrode 25 and the drain electrode 25.

Further, in the TFTs 20B and 20C illustrated in FIGS. 13B and 13C, to prevent influence on the section between the source electrode 25 and the drain electrode 25 even if the foregoing oxygen detachment is generated, the holes H21, H22, and H3 are formed on one side of the source/drain. In this case, the holes H21, H22, and H3 are preferably provided in the vicinity of the channel region (for example, from 10 μm to 20 μm both inclusive apart from the channel region).

In this case, a process for adding oxygen to the oxide semiconductor thin film layer 23 is performed after forming the source/drain electrode 25. After that, the hole is preferably covered with the foregoing planarizing insulating film 51 or the like.

(Step of Forming TFT Substrate 1)

The TFTs 20A to 20C of this embodiment is able to be formed, for example, as follows. First, in the step of forming the contact hole (step S19 of FIG. 7), a section in the vicinity of the channel region in the channel protective layer 24 is also patterned and thereby the foregoing holes H11 to H14, H21, H22, and H3 are formed (step S190 of FIG. 7). After forming the holes H11 to H14, H21, H22, and H3, oxygen annealing treatment is provided and thereby oxygen is supplied to the oxide semiconductor thin film layer 23 through the holes (step S20 or step S22 of FIG. 7).

Specifically, in the case where annealing treatment is performed after forming the source/drain electrode 25 (step S22), the procedure is as follows. First, after forming the source/drain electrode 25, for example, in the atmosphere of oxygen:nitrogen=30:70, annealing treatment at, for example, 300 deg C. is performed for about 2 hours. Thereby, oxygen irradiated through the hole formed in the channel protective layer 24 is supplied into the oxide semiconductor thin film layer 23, or into the channel region in the oxide semiconductor thin film layer 23 through the interface with an adjacent film (gate insulating film 22 or the first channel protective layer 24A). As a result, the transistor characteristics are sufficiently restored. Subsequently, the result is coated with a photosensitive acryl resin or polyimide, baked at, for example, 130 deg C., and exposure and development are provided to perform patterning. After that, the result is fired at, for example, 220 deg C. Even after such a step, oxygen is not significantly detached through the hole, and the transistor characteristics are not deteriorated.

As described above, in this embodiment, in the step of forming the contact hole, the section in the vicinity of the channel region in the channel protective layer 24 is also patterned and thereby the holes H11 to H14, H21, H22, and H3 penetrating to the oxide semiconductor thin film layer 23 are formed. Thus, in addition to the effect in the foregoing first embodiment, the following effect is obtained. That is, after forming such a hole, oxygen annealing treatment is provided, and thereby oxygen is able to be supplied to the oxide semiconductor thin film layer 23 through the hole without adding a photolithography step.

In other words, even after forming the source/drain electrode 25, oxygen is able to be supplied to the oxide semiconductor thin film layer 23 (oxygen is able to be supplemented), and transistor operation and reliability are able to be secured (restored).

3. Module and Application Examples

A description will be given of application examples of the display unit described in the foregoing embodiments. The display unit of the foregoing embodiments is able to be applied to electronic devices in any field such as a television device, a digital camera, a notebook personal computer, a portable terminal device such as a mobile phone, and a video camera. In other words, the display unit of the foregoing embodiments is able to be applied to a display unit of an electronic device in any field for displaying a video signal inputted from outside or a video signal generated inside as an image or a video.

Module

Figure 14:
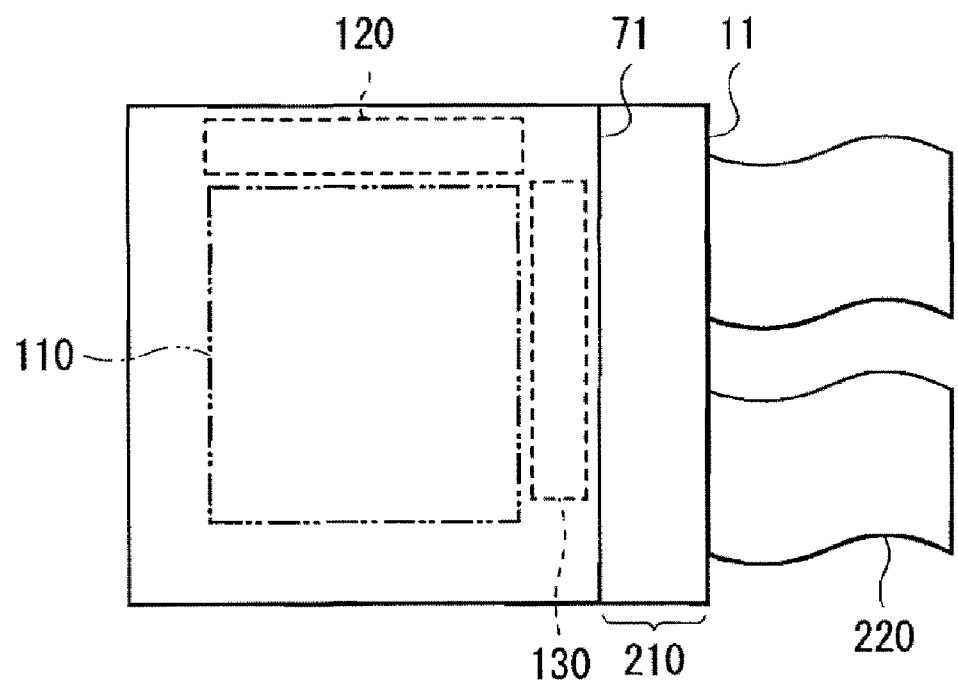
FIG. 14 is a plan view illustrating a schematic structure of a module including the display unit of the foregoing embodiments.

The display unit of the foregoing embodiments is incorporated in various electronic devices such as after-mentioned first to fifth application examples as a module as illustrated in FIG. 14, for example. In the module, for example, a region 210 exposed from the sealing substrate 71 and the adhesive layer 60 is provided in a side of the substrate 11, and an external connection terminal (not illustrated) is formed in the exposed region 210 by extending wirings of a signal line drive circuit 120 and a scanning line drive circuit 130. The external connection terminal may be provided with a Flexible Printed Circuit (FPC) 220 for inputting and outputting a signal.

First Application Example

Figure 15:
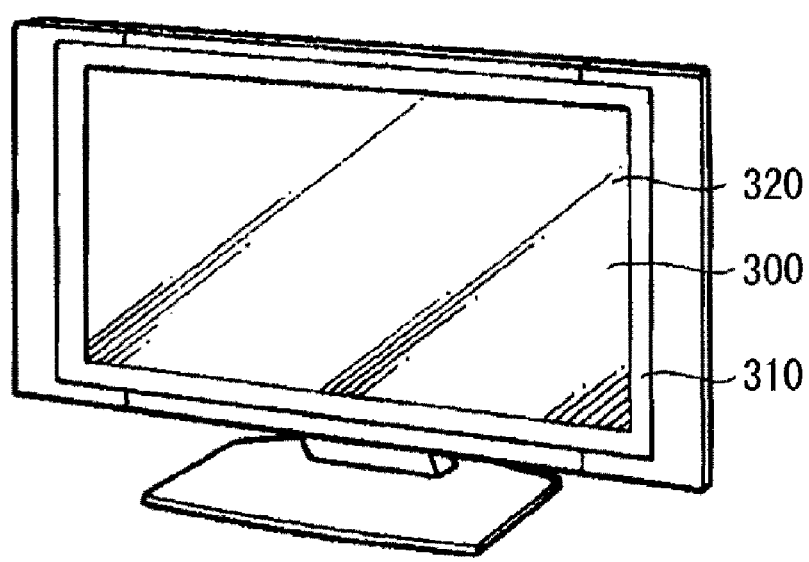
FIG. 15 is a perspective view illustrating an appearance of a first application example of the display unit of the foregoing embodiments.

FIG. 15 is an appearance of a television device to which the display unit of the foregoing embodiments is applied. The television device has, for example, a video display screen section 300 including a front panel 310 and a filter glass 320. The video display screen section 300 is composed of the display unit according to the foregoing respective embodiments.

Second Application Example

Figure 16A:
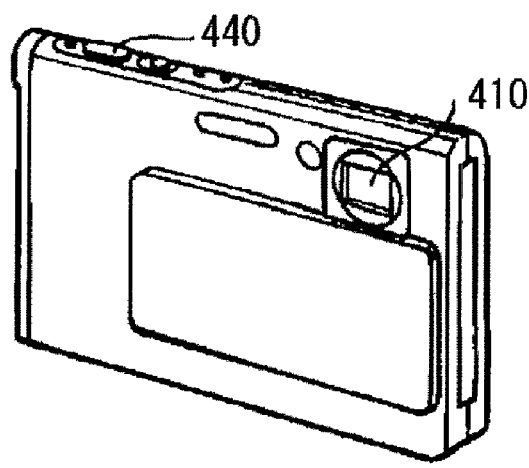
FIG. 16A is a perspective view illustrating an appearance viewed from the front side of a second application example.
Figure 16B:
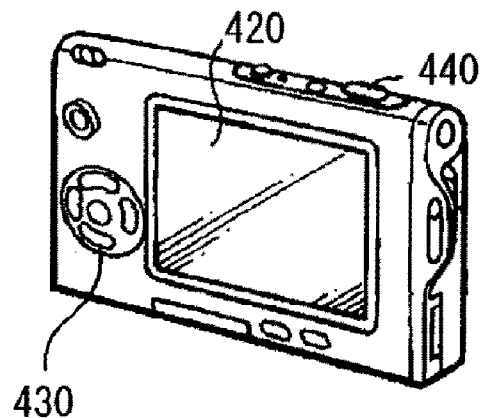
FIG. 16B is a perspective view illustrating an appearance viewed from the rear side of the second application example.

FIGS. 16A and 16B are an appearance of a digital camera to which the display unit of the foregoing embodiments is applied. The digital camera has, for example, a light emitting section for a flash 410, a display section 420, a menu switch 430, and a shutter button 440. The display section 420 is composed of the display unit according to the foregoing respective embodiments.

Third Application Example

Figure 17:
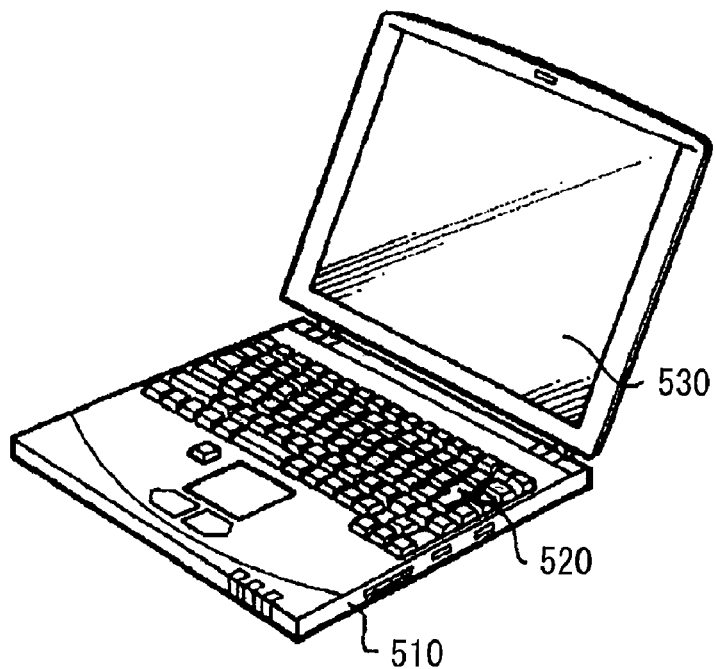
FIG. 17 is a perspective view illustrating an appearance of a third application example.

FIG. 17 is an appearance of a notebook personal computer to which the display unit of the foregoing embodiments is applied. The notebook personal computer has, for example, a main body 510, a keyboard 520 for operation of inputting characters and the like, and a display section 530 for displaying an image. The display section 530 is composed of the display unit according to the foregoing respective embodiments.

Fourth Application Example

Figure 18:
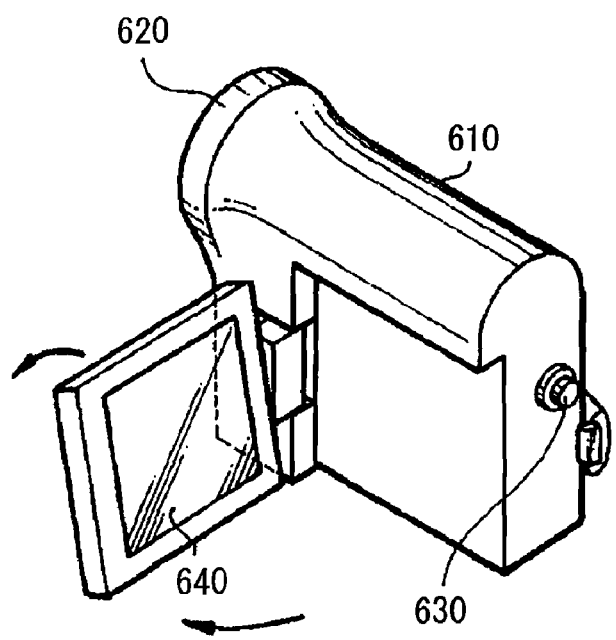
FIG. 18 is a perspective view illustrating an appearance of a fourth application example.

FIG. 18 is an appearance of a video camera to which the display unit of the foregoing embodiments is applied. The video camera has, for example, a main body 610, a lens for capturing an object 620 provided on the front side face of the main body 610, a start/stop switch in capturing 630, and a display section 640. The display section 640 is composed of the display unit according to the foregoing respective embodiments.

Fifth Application Example

FIGS. 19A to 19G illustrate an appearance of a mobile phone to which the display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing respective embodiments.

While the invention has been described with reference to the first and the second embodiments and the application examples thereof, the invention is not limited to the foregoing embodiments and the like, and various modifications may be made.

For example, in view of supplying sufficient oxygen to the oxide semiconductor thin film 23 and decreasing oxygen detachment, oxygen annealing treatment as described below with reference to FIG. 7 is preferably performed.

That is, first, ideally, the following step 1 is preferably executed.

1. At the time of forming the oxide semiconductor thin film 23, the oxygen amount is optimized (refer to referential symbol P1 in FIG. 7: step S130), and oxygen detachment is prevented from being generated before the channel protective layer 24 having sufficient oxygen barrier properties is formed.

However, in the foregoing step 1, the technique is considerably limited since the step of forming the oxide semiconductor thin film 23 or the first channel protective layer 24A itself is a high temperature step. Thus, oxygen annealing treatment is preferably performed at the time of steps described as the following steps 2 to 5.

2. At the time after forming the oxide semiconductor thin film 23 and before forming the first channel protective layer 24A, a process of supplying oxygen to the oxide semiconductor thin film 23 such as nitric oxide plasma, oxygen plasma, and ozone treatment is introduced (refer to referential symbol P2 in FIG. 7: step S14).

3. At the time after forming the first channel protective layer 24A and before forming the second channel protective layer 24B, oxygen annealing treatment is performed (refer to referential symbol P3 in FIG. 7: step S16).

4. At the time after forming the first channel protective layer 24A and the second channel protective layer 24B with low oxygen permeability, strong oxygen annealing treatment is performed (refer to referential symbol P4 in FIG. 7: step S18).

5. At the time after forming the first channel protective layer 24A and the second channel protective layer 24B, a contact hole is formed (refer to referential symbol P5 in FIG. 7: step S190). After that, after oxygen annealing treatment is performed, the source/drain electrode 25 is formed (refer to referential symbol P5 in FIG. 7: step S20).

Further, in the case where oxygen detachment is generated in the step of forming the source/drain electrode 25, oxygen annealing treatment is preferably performed at the time of step described as the following step 6.

6. At the time after forming the first channel protective layer 24A and the second channel protective layer 24B, the holes H11 to H14, H21, H22, and H3 described in the foregoing second embodiment are formed (refer to referential symbol P6 in FIG. 7: step S190). After that, after the source/drain electrode 25 is formed, oxygen annealing treatment is performed (refer to referential symbol P6 in FIG. 7: step S22). After that, the hole is preferably covered with the foregoing planarizing insulating film 51 or the like.

Further, for example, the material, the thickness, the film-forming method, the film-forming conditions and the like of each layer are not limited to those described in the foregoing embodiments and the like, but other material, other thickness, other film-forming method, and other film-forming conditions may be adopted. Specifically, in the foregoing embodiments and the like, the description has been given of the case that the second channel protective layer 24B is made of the material with low oxygen permeability and low water vapor permeability, but the structure is not limited thereto. That is, for example, it is enough that one or both of the first channel protective layer 24A and the second channel protective layer 24B is made of the material with low oxygen permeability and low water vapor permeability.

Further, in the foregoing embodiments and the like, the description has been given of the organic light emitting devices 10R, 10B, and 10G with the specific example. However, it is not necessary to provide all the layers, and other layer may be further included.

In addition, the invention is able to be applied to a display unit including other display device such as a liquid crystal display device, an inorganic electroluminescence device, an electrodeposition display device, and an electrochromic display device in addition to the organic light emitting device.

The present application contains subject matter related to that disclosed in Japanese Priority Patent Application JP 2008-308271 filed in the Japanese Patent Office on Dec. 3, 2008, the entire contents of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A thin film transistor comprising:
a gate electrode;
a gate insulting film formed on the gate electrode;
an oxide semiconductor thin film layer forming a channel region corresponding to the gate electrode, the oxide semiconductor thin film layer on the gate insulating film;
a channel protective layer that is formed at least in a region corresponding to the channel region on the gate insulating film and the oxide semiconductor thin film layer, the channel protective layer including a first channel protective layer on a lower layer side and a second channel protective layer on an upper layer side; and
a source/drain electrode that is formed on the channel protective layer and electrically connected to the oxide semiconductor thin film layer,
wherein,
the first channel protective layer is made of an oxide insulating material,
at least one of the first channel protective layer and the second channel protective layer is made of a low oxygen permeable material, and
an aperture penetrating to the oxide semiconductor thin film layer is provided in a vicinity of the channel region in the channel protective layer, the aperture being separate from a contact hole through which the source/drain electrode is electrically connected to the oxide semiconductor thin film layer.

2. The thin film transistor according to claim 1, wherein the first channel protective layer is made of a material that does not make oxygen detached from the oxide semiconductor thin film layer.

3. The thin film transistor according to claim 1, wherein the low oxygen permeable material has oxygen permeability factor of 0.1 (cc/m$^2$ day) or less.

4. The thin film transistor according to claim 1, wherein the first channel protective layer is made of a material that does not supply hydrogen to the oxide semiconductor thin film layer.

5. The thin film transistor according to claim 1, wherein at least one of the first channel protective layer and the second channel protective layer is made of a low water vapor permeable material.

6. The thin film transistor according to claim 5, wherein the low water vapor permeable material has water vapor permeability factor of 0.1 (g/m$^2$ day) or less.

7. The thin film transistor according to claim 2, wherein the first channel protective layer is composed of silicon oxide, tantalum oxide, titanium oxide, hafnium oxide, zirconium oxide, yttrium oxide, aluminum oxide, a nitrogenous material thereof, or silicon nitride.

8. A display unit comprising:
a display device; and
a thin film transistor for driving the display device, the thin film transistor including
a gate electrode,
a gate insulting film formed on the gate electrode,
an oxide semiconductor thin film layer forming a channel region corresponding to the gate electrode, the oxide semiconductor thin film layer on the gate insulating film,
a channel protective layer that is formed at least in a region corresponding to the channel region on the gate insulating film and the oxide semiconductor thin film layer, the channel protective layer including a first channel protective layer on a lower layer side and a second channel protective layer on an upper layer side, and
a source/drain electrode that is formed on the channel protective layer and is electrically connected to the oxide semiconductor thin film layer,
wherein,
the first channel protective layer is made of an oxide insulating material,
at least one of the first channel protective layer and the second channel protective layer is made of a low oxygen permeable material, and
an aperture penetrating to the oxide semiconductor thin film layer is provided in a vicinity of the channel region in the channel protective layer, the aperture being separate from a contact hole through which the source/drain electrode is electrically connected to the oxide semiconductor thin film layer.

9. The display unit according to claim 8, wherein the display device is an organic light emitting device that has an anode, an organic layer including a light emitting layer, and a cathode.

10. A method of manufacturing a thin film transistor comprising the steps of:
forming a gate electrode and a gate insulating film in this order on a substrate;
forming an oxide semiconductor thin film layer having a channel region corresponding to the gate electrode;
forming a channel protective layer including a first channel protective layer on a lower layer side and a second channel protective layer on an upper layer side in at least a region corresponding to the channel region on the gate insulating film and the oxide semiconductor thin film layer;
forming a contact hole for obtaining electrical connection with the oxide semiconductor thin film layer by patterning the channel protective layer; and
forming a source/drain electrode on the channel protective layer and the contact hole, the source/drain electrode being electrically connected to the oxide semiconductor thin film layer,
wherein,
an oxide insulating material is used as the first channel protective layer, and a low oxygen permeable material is used as at least one of the first channel protective layer and the second channel protective layer, and
in the step of forming the contact hole, the channel protective layer is further patterned to form, in addition to the contact hole, an aperture in a vicinity of the channel region, the aperture penetrating to the oxide semiconductor thin film.

11. The method according to claim 10, wherein in the step of forming the first channel protective layer, a composition of film-forming gas does not contain hydrogen.

12. The method according to claim 10, wherein oxygen annealing treatment is carried out after forming the aperture, oxygen being supplied to the oxide semiconductor thin film layer through the aperture.

13. The method according to claim 10, wherein oxygen annealing treatment is carried out (i) after forming the oxide semiconductor thin film layer and before forming the first channel protective layer, (ii) after forming the first channel protective layer and before forming the second channel protective layer, or (iii) after forming the second channel protective layer, oxygen supplied to the oxide semiconductor thin film layer during the oxygen annealing treatment.

* * * * *